(12) United States Patent
Chung

(10) Patent No.: US 7,957,191 B2
(45) Date of Patent: Jun. 7, 2011

(54) METHOD OF PROGRAMMING NON-VOLATILE MEMORY DEVICE

(75) Inventor: Sung Jae Chung, Seoul (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 185 days.

(21) Appl. No.: 12/132,068

(22) Filed: Jun. 3, 2008

(65) Prior Publication Data

US 2009/0168536 A1  Jul. 2, 2009

(30) Foreign Application Priority Data

Dec. 27, 2007  (KR) .................. 10-2007-0138856

(51) Int. Cl.
*G11C 16/04* (2006.01)
(52) U.S. Cl. .......... 365/185.13; 365/185.02; 365/185.03
(58) Field of Classification Search .............. 365/185.13
See application file for complete search history.

(56) References Cited

U.S. PATENT DOCUMENTS

| 7,738,291 B2* | 6/2010 | Aritome et al. | 365/185.03 |
| 2008/0049494 A1* | 2/2008 | Aritome | 365/185.02 |
| 2008/0247234 A1* | 10/2008 | Lee | 365/185.13 |

FOREIGN PATENT DOCUMENTS

KR  1020050109835  11/2005

OTHER PUBLICATIONS

Korean Notice of Allowance for Korean application No. 10-2007-0138856, citing the attached reference(s).

* cited by examiner

*Primary Examiner* — Huan Hoang
*Assistant Examiner* — Jason Lappas
(74) *Attorney, Agent, or Firm* — Lowe Hauptman Ham & Berner LLP

(57) ABSTRACT

A method of programming a non-volatile memory device includes applying a power supply voltage to a drain select line, applying a high level voltage to a drain-side pass word line or a source-side pass word line, and applying a pass voltage to unselected word lines and a program voltage to a selected word line. The high level voltage is applied to the drain-side pass word line or the source-side pass word line before applying the pass voltage to the unselected word lines and the program voltage to the selected word line.

18 Claims, 3 Drawing Sheets

100

Threshold voltage distribution at the time of program operation

Threshold voltage distribution at the time of erase operation

METHOD OF PROGRAMMING NON-VOLATILE MEMORY DEVICE

CROSS-REFERENCES TO RELATED APPLICATIONS

The present application claims priority to Korean patent application number 10-2007-0138856, filed on Dec. 27, 2007, which is incorporated by reference in its entirety.

BACKGROUND OF THE INVENTION

The present invention relates to a method of programming a non-volatile memory device.

Recently, there have been increasing demands for non-volatile memory devices which can be electrically programmed and erased and do not need the refresh function of rewriting data at specific intervals.

A non-volatile memory device generally includes a memory cell array in which cells for storing data therein are arranged in matrix form, and a page buffer for writing memory into specific cells of the memory cell array or reading memory stored in a specific cell. The page buffer includes a bit line pair connected to memory cells, a register for temporarily storing data to be written into a memory cell array, or reading data of a specific cell from the memory cell array and temporarily storing the read data therein, a sense node for sensing the voltage level of a specific bit line or a specific register, and a bit line selection unit for controlling the connection between a specific bit line and the sense node, i.e., determining whether or not to connect a specific bit line to the sense node.

In a cell array of the non-volatile memory device, as mentioned above, cells positioned at the outermost locations, that is, cells adjacent to a drain select transistor or cells adjacent to a source select transistor have a slower program speed than that of other cells due to the coupling effect. Accordingly, a uniformity characteristic of the entire cells is degraded, generating a disturbance problem, and so on. To solve the problems, a dummy cell is added between the outermost cell and each select transistors. The dummy cell is the same non-volatile memory cell as a memory cell and does not have a data storage function. However, this dummy cell also generates the same problems as those of the outermost cell.

BRIEF SUMMARY OF THE INVENTION

The present invention is directed to a method of programming a non-volatile memory device, which can reduce disturbance by advancing the turn-on time of a dummy cell at the time of a program operation.

A method of programming a non-volatile memory device according to an aspect of the present invention includes applying a power supply voltage to a drain select line, applying a high level voltage to a drain-side pass word line or a source-side pass word line, and applying a pass voltage to unselected word lines and a program voltage to a selected word line, wherein applying the high level voltage to the drain-side pass word line or the source-side pass word line is performed before applying the pass voltage to the unselected word lines and the program voltage to the selected word line.

A method of programming a non-volatile memory device according to another aspect of the present invention includes applying a power supply voltage to a drain select line, applying a high level voltage to a drain-side pass word line and a source-side pass word line, and applying a pass voltage to unselected word lines and a program voltage to a selected word line, wherein applying the high level voltage to the drain-side pass word line and the source-side pass word line is performed before applying the pass voltage to the unselected word lines and the program voltage to the selected word line.

DESCRIPTION OF SPECIFIC EMBODIMENTS

Now, a specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the scope of the present invention.

Figure 1:
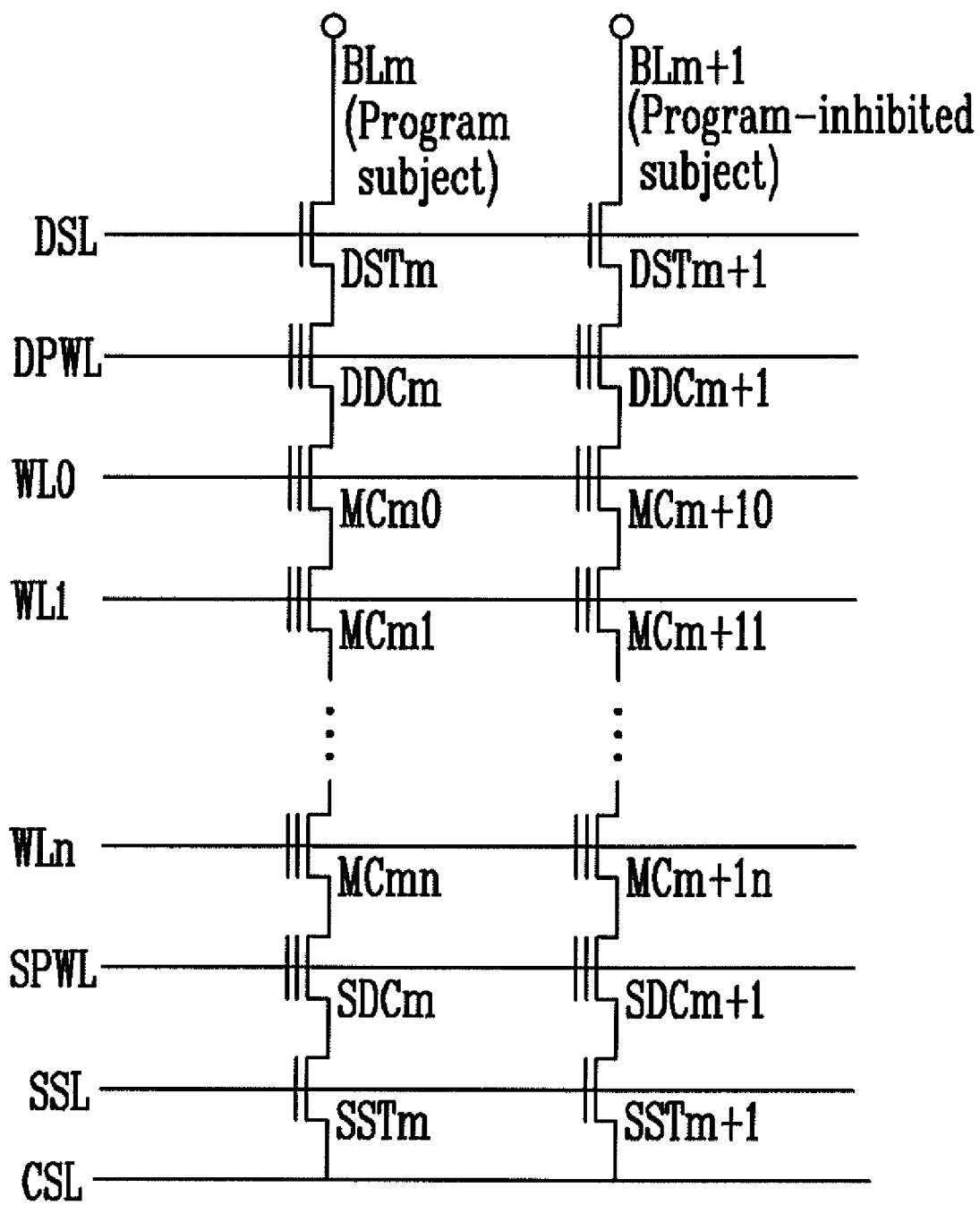
FIG. 1 is a circuit diagram illustrating a part of a memory cell array used in the present invention.

FIG. 1 is a circuit diagram illustrating a part of a memory cell array used in the present invention.

A memory cell array 100 includes drain select transistors DSTm, DSTm+1 connected between a bit line BLm, BLm+1 and a memory cell, and source select transistors SSTm, SSTm+1 connected between a common source line CSL and a memory cell.

The memory cell array 100 further includes a plurality of memory cells MCm0 to MCmn, MCm+10 to MCm+1n connected in series between the source select transistors SSTm, SSTm+1 and the drain select transistors DSTm, DSTm+1. The plurality of memory cells connected in series is called a cell string.

The respective memory cells are connected to word lines WL0 to WLn, and can be classified into pages, that is, groups of cells to which various program voltages, a read voltage, etc. are applied. That is, cells belonging to the same page are connected to the same word line.

Further, a dummy cell is further included between the memory cells which are adjacent to the select transistors and each select transistors. Dummy cells adjacent to the drain select transistors are called drain-side dummy cells DDCm, DDCm+1 and dummy cells adjacent to the source select transistors are called source-side dummy cells SDCm, SDCm+1. The dummy cells are the same non-volatile memory cells as other memory cells, but are cells not intended for data storage. The dummy cells are provided to solve the problems such as a reduction in the program speed of cells adjacent to each select transistors of memory cells.

Here, a word line for applying a high voltage to the drain-side dummy cells DDCm, DDCm+1 is called a drain-side pass word line DPWL, and a word line for applying a high voltage to the source-side dummy cells SDCm, SDCm+1 is called a source-side pass word line SPWL.

Problems occurring in this memory cell array are described below.

Figure 2A:
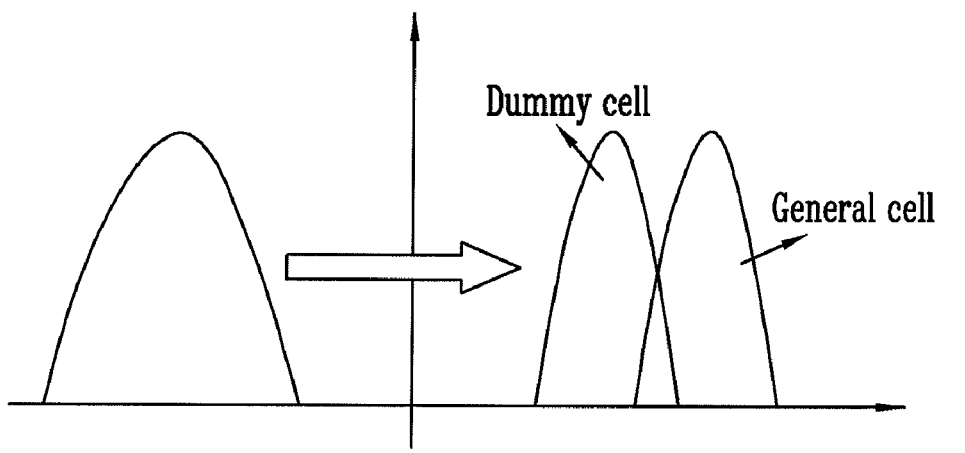
FIG. 2A shows threshold voltage distributions of cells in a conventional program operation.
Figure 2B:
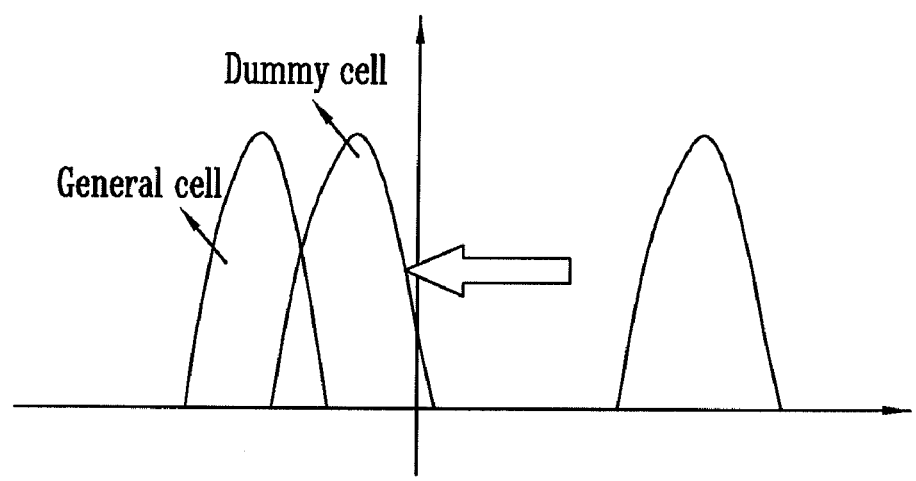
FIG. 2B shows threshold voltage distributions of cells in a conventional erase operation.

FIG. 2A shows threshold voltage distributions of cells in a conventional program operation, and FIG. 2B shows threshold voltage distributions of cells in a conventional erase operation.

As shown in FIGS. 2A and 2B, the program and erase speeds of dummy cells are slower than those of general memory cells. That is, although the same program voltage is applied to the dummy cells and the general memory cells, the threshold voltage of the dummy cells is very lower than that of the general memory cells. Likewise, although an erase operation is performed on the dummy cells and the general memory cells, the dummy cells have a higher threshold voltage than that of the general memory cells. This is because the dummy cells are located at the outermost positions in the cell string. If a program operation is performed in this structure, there is a possibility that program disturbance may occur in program-inhibited cells.

Referring back to FIG. 1, if it is sought to program a specific cell, a program voltage Vpgm is applied to a word line of a corresponding cell, and a pass voltage Vpass which is lower than the program voltage Vpgm is applied to word lines of the remaining cells. A bit line connected to a target program cell maintains a low-level state and the remaining bit lines are precharged to a high level. Thus, the voltage of the corresponding cell is raised by channel boosting, so that the corresponding cell is not programmed.

In the case where a dummy cell is included, the pass voltage is applied to each pass word line so that the dummy cell is turned on. As mentioned earlier, the program and erase speeds of a dummy cell are slower than those of other cells. Thus, a dummy cell on which an erase operation has been performed may have the threshold voltage of 0V or higher.

If the pass voltage is applied to this dummy cell, a corresponding cell is not turned on, or has a small amount of current although the pass voltage is applied thereto. Consequently, a bit line, that is, a program-inhibited subject is not sufficiently precharged to a high level. In this case, the intended voltage rising effect of a program-inhibited cell by channel boosting may be lower than necessary, resulting in a disturbance phenomenon in which the program-inhibited cell is programmed.

To solve this problem, in the present invention, a pass voltage applied to a dummy cell is applied earlier than a program voltage or a pass voltage applied to general memory cells.

Figure 3:
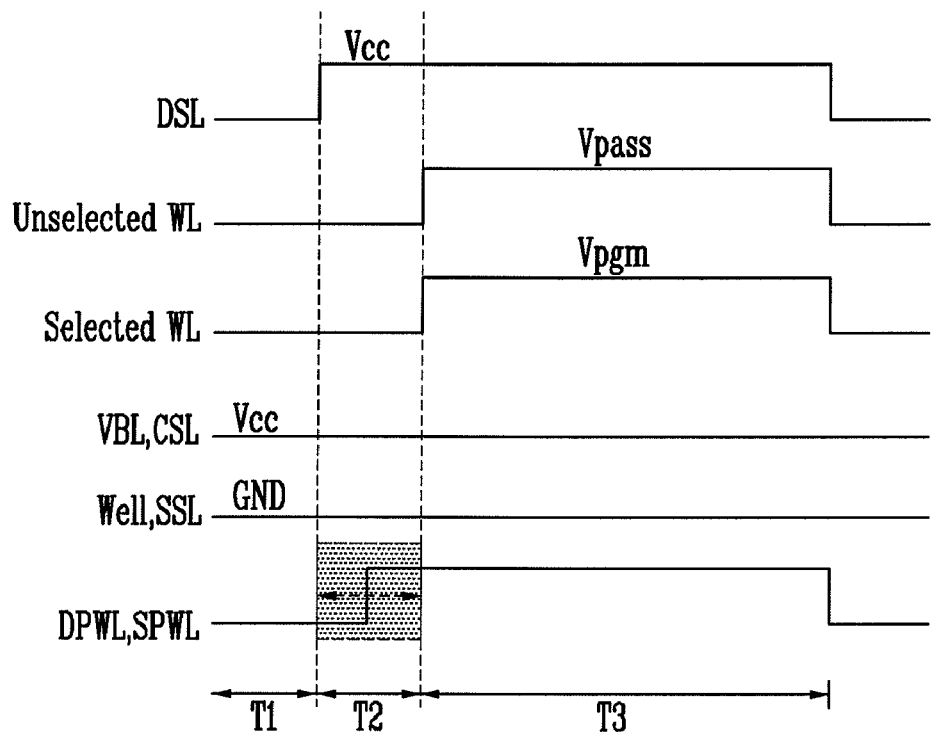
FIG. 3 shows a waveform of various voltages applied in a program operation of a non-volatile memory device in accordance with an embodiment of the present invention.

FIG. 3 shows a waveform of various voltages applied in a program operation of a non-volatile memory device in accordance with an embodiment of the present invention.

A power supply voltage Vcc is applied to a common source line CSL in order to increase the cut-off effect by a source select transistor SST. Meanwhile, a bit line, that is, a program-inhibited subject is precharged to a high level VBL. Here, a bit line, that is, a program subject is precharged to a low level (T1 period).

Next, the power supply voltage Vcc is applied to a drain select line DSL to thereby turn on a drain select transistor DST. A high level voltage is applied to a drain-side pass word line DPWL or a source-side pass word line SPWL to thereby turn on a drain-side dummy cell DDC or a source-side dummy cell SDC (T2 period).

In the present invention, the drain-side dummy cell DDC or the source-side dummy cell SDC is turned on earlier than general memory cells. To this end, before applying a pass voltage Vpass or a program voltage Vpgm to each word line, the power supply voltage is applied to a pass word line.

Here, the time when a high level voltage is applied to the pass word line can be controlled according to an embodiment. That is, a high level voltage can be applied to the pass word lines DPWL, SPWL simultaneously with the power supply voltage Vcc applied to the drain select line DSL.

Before a program voltage Vpgm or a pass voltage Vpass is applied to a word line of general memory cells and after the power supply voltage Vcc is applied to the drain select line DSL, a high level voltage is applied to each of the pass word lines DPWL, SPWL.

Further, according to an embodiment, a high level voltage can be applied to the pass word lines DPWL, SPWL at the same time.

Meanwhile, the level of voltage applied to each of the pass word lines DPWL, SPWL is identical to that of a pass voltage Vpass, which is subsequently applied to the word line of general memory cells.

If each dummy cell is previously driven as described above, a bit line, that is, a program-inhibited subject can be sufficiently precharged to a high level, so program disturbance can be prevented.

Next, after the power supply is applied to each of the pass word lines DPWL, SPWL, the program voltage Vpgm or the pass voltage Vpass is applied to each word line of general memory cells (T3 period). Here, the program voltage Vpgm is applied to a selected word line, that is, a program subject, and the pass voltage Vpass is applied to unselected word lines, that is, a non-program subject.

A configuration of the present invention is described below with reference to the flowchart of FIG. 4.

Figure 4:
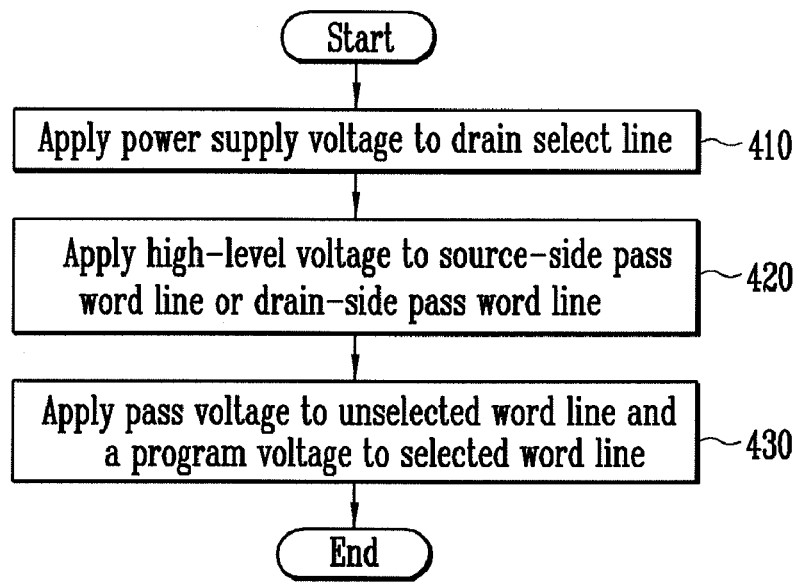
FIG. 4 is a flowchart illustrating a programming method in accordance with an embodiment of the present invention.

FIG. 4 is a flowchart illustrating a programming method in accordance with an embodiment of the present invention. First, the power supply voltage is applied to the drain select line at step 410.

A high level voltage is then applied to the source-side pass word line or the drain-side pass word line at step 420.

According to an embodiment, the steps 410, 420 can be performed at the same time.

Further, according to an embodiment, a high level voltage can be applied to either the source-side pass word line or the drain-side pass word line, or the high level voltage can be applied to the source-side pass word line and the drain-side pass word line at the same time.

Next, a pass voltage is applied to unselected word lines and a program voltage is applied to a selected word line in order to perform a program operation at step 430.

As described above, according to the present invention, before a program voltage or a pass voltage is applied to a word line of general memory cells, dummy cells can be turned on. Thus, a bit line, that is, a program-inhibited subject can be sufficiently precharged to a high level. Accordingly, proper channel boosting can be generated to thereby secure program inhibition. That is, a program disturbance phenomenon can be prevented.

The embodiment disclosed herein has been proposed to allow a person skilled in the art to easily implement the present invention in various ways. Therefore, the scope of the present invention is not limited by or to the embodiment as described above, and should be construed to be defined by the appended claims and their equivalents.

What is claimed is:

1. A method of programming a selected memory cell of a non-volatile memory device comprising a drain select line, a source select line, a pass word line and a plurality of word lines, wherein the pass word line and the plurality of word lines are electrically connected between the drain and the source select lines, in series, the method comprising:

applying a power supply voltage to the drain select line;
applying a high level voltage to the pass word line; and
applying a pass voltage to unselected word lines of the plurality of word lines and a program voltage to a selected word line which corresponds to the selected memory cell of the plurality of word lines, after the applying the high level voltage to the pass word line.

2. The method of claim 1, wherein a voltage level of the high level voltage is same as that of the pass voltage.

3. The method of claim 1, wherein the power supply voltage and the high level voltage are applied at the same time.

4. A method of programming a selected memory cell of a non-volatile memory device comprising a drain select line, a source select line, a first pass word line, a second pass word line, and a plurality of word lines, wherein the first and the second pass word lines and the plurality of word lines are electrically connected between the drain and the source select lines, in series, the method comprising:
 applying a power supply voltage to the drain select line;
 applying a high level voltage to the first pass word line adjacent to the drain select line and the second pass word line adjacent to the source select line; and
 applying a pass voltage to unselected word lines of the plurality of word lines and a program voltage to a selected word line which corresponds to the selected memory cell of the plurality of word lines, after the applying the high level voltage to the first and the second pass word lines.

5. The method of claim 4, wherein a voltage level of the high level voltage is same as that of the pass voltage.

6. The method of claim 4, wherein the power supply voltage and the high level voltage are applied at the same time.

7. The method of claim 1, wherein the high level voltage is applied to the pass word line, after applying the power supply voltage to the drain select line.

8. The method of claim 4, wherein the high level voltage is applied to the first and second pass word lines, after applying the power supply voltage to the drain select line.

9. The method of claim 1, wherein the pass word line is formed adjacent to the drain select line.

10. The method of claim 1, wherein the pass word line is formed adjacent to a source select line.

11. A method of programming a selected memory cell of a non-volatile memory device, comprising a drain select transistor, a source select transistor, a first dummy cell, a second dummy cell, and a plurality of memory cells, wherein the first and the second dummy cells and the plurality of memory cells are electrically connected between the drain and the source select transistors, in series, the method comprising:
 applying a power supply voltage to the drain select transistor;
 applying a high level voltage to the first dummy cell adjacent to the drain select transistor and the second dummy cell adjacent to the source select transistor, after the applying the power supply voltage to the drain select transistor; and
 applying a pass voltage to unselected memory cells of the plurality of memory cells and a program voltage to the selected memory cell of the plurality of memory cells, after the applying the high level voltage to the first and the second dummy cells.

12. The method of claim 11, wherein a threshold voltage change of each of the first and the second dummy cells is slower than that of each of the plurality of memory cells.

13. The method of claim 11, wherein the first and the second dummy cells are not for storing data.

14. The method of claim 11, wherein a voltage level of the high level voltage is same as that of the pass voltage.

15. The method of claim 1, wherein a threshold voltage change of each of memory cells connected to the pass word line is slower than that of each of memory cells connected to the plurality of word lines.

16. The method of claim 1, wherein memory cells connected to the pass word line are not for storing data.

17. The method of claim 4, wherein a threshold voltage change of each of memory cells connected to the first and the second pass word lines is slower than that of each of memory cells connected to the plurality of word lines.

18. The method of claim 4, wherein memory cells connected to the first and the second pass word line are not for storing data.

* * * * *